United States Patent [19]

Pinckaers et al.

[11] 4,079,331

[45] Mar. 14, 1978

[54] AMPLIFIER SYSTEM WITH SPECIAL FEEDBACK CIRCUITS

[75] Inventors: B. Hubert Pinckaers, Edina; Robert T. Ruminsky, Minneapolis, both of Minn.

[73] Assignee: Honeywell Inc., Minneapolis, Minn.

[21] Appl. No.: 766,996

[22] Filed: Feb. 9, 1977

[51] Int. Cl.² .......................... H03F 17/00; H03F 1/36
[52] U.S. Cl. ......................................... 330/2; 219/499; 328/3; 330/59; 330/104; 330/108; 330/110
[58] Field of Search .................... 330/2, 59, 97, 104, 330/108, 110, 146; 318/678, 681; 328/3; 307/310; 219/499, 501

[56] References Cited

U.S. PATENT DOCUMENTS

| | | | |
|---|---|---|---|
| 3,535,561 | 10/1970 | Pinckaers | 307/310 |
| 3,604,957 | 9/1971 | Satula | 307/310 |
| 3,639,824 | 2/1972 | Malavasi | 330/110 X |
| 3,705,316 | 12/1972 | Burrows et al. | 307/310 X |
| 3,777,187 | 12/1973 | Kohn | 307/310 |
| 3,816,760 | 6/1974 | Slawson et al. | 330/104 X |
| 3,819,960 | 6/1974 | Kohn et al. | 219/501 X |
| 3,917,993 | 11/1975 | Picmaus et al. | 330/104 X |
| 3,939,433 | 2/1976 | Okada et al. | 330/110 X |

OTHER PUBLICATIONS

Cook et al., "Feedback T Yields High Input Impedances", Electronics, 4/17/67, p. 91.

*Primary Examiner*—James B. Mullins
*Attorney, Agent, or Firm*—Alfred N. Feldman

[57] ABSTRACT

A condition responsive element, disclosed as a negative temperature coefficient thermistor, operates in conjunction with a bridge circuit to provide a differential input to a special direct current amplifier system. The amplifier system utilizes a combination of positive feedback and negative feedback with the negative feedback always exceeding the level of the positive feedback under steady state operating conditions. The output of the amplifier means further is connected to the lowest energizing potential for the amplifier means through a network that includes a relatively fixed voltage dropping means so that changes in the negative feedback can be made to change the gain of the amplifier system with a minimum of offset or change in calibration of the condition responsive device.

15 Claims, 3 Drawing Figures

AMPLIFIER SYSTEM WITH SPECIAL FEEDBACK CIRCUITS

BACKGROUND OF THE INVENTION

In condition control equipment, particularly in temperature regulating systems, it is desirable to be able to adjust the sensing element, its associated circuitry, and the electronics to provide functions which will match and properly control various types of heating and cooling loads. In the electronic control of heating and cooling equipment it is often desirable to be able to adapt one condition responsive system to control various types of heating loads, such as gas fired furnaces, oil fired furnaces, and electrically heated furnaces. This same temperature or condition control equipment is used to control various types of air conditioning compressors which may involve a single compressor, or staged and variable speed compressors to vary the cooling, as the circumstances dictate. In the past it has been difficult to design a single condition responsive or temperature control system and its associated electronics which will match various loads with a minimum of alteration in the circuitry.

SUMMARY OF THE INVENTION

The invention of the present application is directed to a unique type of direct current amplifier that can be readily adjusted in gain, but which causes a minimum offset in the amount of the condition being sensed because of the change in the gain. The change in the gain of the amplifier system is necessary in order to couple the control system to various types of loads that respond in different manners.

Also encompassed in the unique amplifier arrangement disclosed is a provision for the addition of a time delay which prevents staged loads from being actuated simultaneously in the event that there is a change of set point of the control system or a temporary power failure. Changes in set point and failure of power to electronic temperature control systems is quite common in todays marketplace. If the control equipment is not provided with some type of time delay arrangement, the loads, such as heating or cooling loads, are all suddenly energized when the set point of the temperature control system is changed or in the event of a power failure. This throws an abnormal load on the electric utility supplying power and can cause severe disruptions. Ordinary time delay circuits, to provide a relatively uniform delay in staging, normally require that individual time delay devices or circuits be provided between the various stages. This can all be simply overcome by the unique direct current amplifier system utilizing both a positive and negative feedback wherein the negative feedback always exceeds the positive feedback for stability. The positive feedback can be divided equally and coupled to the lowest energizing potential for the amplifier system by a single capacitor which will provide an uniform time delay either on charging or discharging thereby providing a simple expedient for providing the time delay function for the system.

The adjustable gain of the present system is accomplished by changing a value of the negative feedback, but the value is limited in its effect on the set point of the system by dropping a portion of the feedback voltage across what can be considered as a relatively fixed voltage dropping device. If the dropping device is a light emitting diode, the voltage dropping device also can be used as a visual indication of the condition of the output voltage magnitude of the amplifier system.

The various advantages of the present system are combined into a single amplifier system that in turn can be the main control element for a condition control device.

DESCRIPTION OF THE PREFERRED EMBODIMENT

Figure 1:
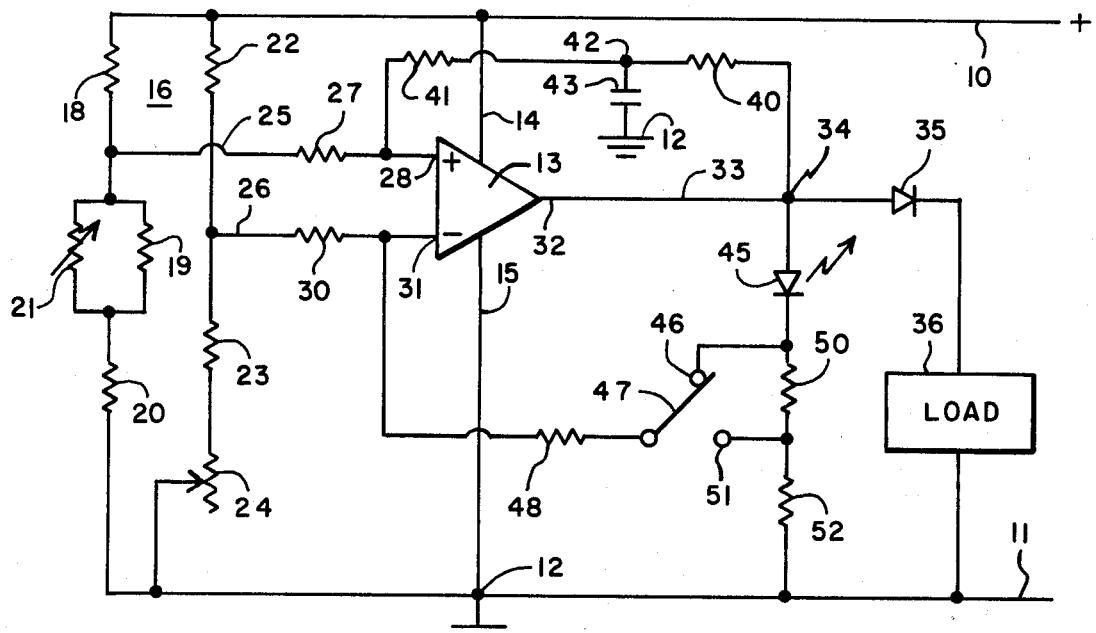
FIG. 1 is a schematic drawing of a complete condition control device which incorporates the special direct current amplifier means.

In FIG. 1 there is disclosed a complete control device that utilizes the unique direct current amplifier system of the present invention. The condition control device disclosed incorporates a time delay feature, an adjustable gain feature, and a visual indication of the output status of the device. These individual features will be brought out in detail in connection with the following description. Some of the features are optional to the control device, as will become apparent as the complete description progresses.

A direct current power supply is shown connected to conductors 10 and 11 with conductor 10 connected to the positive terminal of a power supply while conductor 11 is grounded at 12. Conductor 10 provides for the highest energizing potential for a direct current amplifier means 13 via a conductor 14. The amplifier means 13 is connected by conductor 15 to the ground 12 and this is the lowest energizing potential for the amplifier means 13.

Conductors 10 and 11 further provide a direct current potential for a condition responsive signal means generally disclosed at 16. The condition responsive signal means 16 includes a voltage divider network including resistors 18, 19, 20 and a temperature responsive element 21. The temperature responsive element 21, in the simplest version of the present device, would be a negative temperature coefficient thermistor with the resistor 19 being paralleled across the thermistor 21 to linearize the thermistor's response to temperature. A second voltage divider network includes a resistor 22, a resistor 23, and a set point potentiometer 24. The resistors 18, 19, 20, thermistor 21, resistor 22, resistor 23 and the set point potentiometer 24 form a conventional bridge circuit and are a typical disclosure of a temperature responsive bridge element or condition responsive signal means 16.

The output from the condition responsive signal means 16 is on conductors 25 and 26 across which a differential voltage is generated when the bridge is unbalanced. The conductor 25 is connected through a resistor 27 to a non-inverting input 28 of the amplifier means 13. The conductor 26 is connected through a further resistor 30 to the inverting terminal 31 of the amplifier means 13. The resistors 27 and 30 form part of input impedance resistance means for the amplifier means 13 and are selected to be compatible with the feedback circuits that will be described subsequently.

The amplifier means 13 has an output means 32 that is connected by conductor 33 to a junction 34 where the output means 32 is connected through a diode 35 to any type of convenient load 36 that in turn is connected back to the conductor 11. The diode 35 is provided for reverse voltage protection.

A positive feedback impedance means including a pair of resistors 40 and 41 are provided between the output means 32 of the amplifier means 13 and its non-inverting terminal 28. The resistors 40 and 41 have a junction 42 that is connected by a capacitor 43 to ground 12 which again is the lowest energizing potential for the amplifier means 13. The resistors 40 and 41, which form part of the positive feedback impedance means, can be selected to be any desired ratio of the necessary resistance in the feedback circuit, but in the present arrangement where capacitor 43 is used as a time delay device, the resistors 40 and 41 would normally be selected as equal in value.

A negative feedback impedance means is provided between the output means 32 of the amplifier means 13 and its inverting terminal 31. The negative feedback impedance means includes a light emitting diode 45, a switch terminal 46, a switch element 47, and a resistor 48. The negative feedback impedance means described can be altered by the use of an additional resistor 50 and a switch terminal 51 so that the switch element 47 can be connected to either the switch terminal 46 or the switch terminal 51 as desired, as will be explained later.

A further circuit is completed from the junction 34 through the light emitting diode 45 and the resistor 50 to a further resistor 52 that is connected to the ground 12. The use of the negative feedback circuit variation provides for an adjustable gain for the amplifier system and will be described in some detail in connection with FIGS. 2 and 3.

OPERATION OF FIG. 1

In FIG. 1 a condition control device has been disclosed as a temperature or condition responsive system 16 which senses temperature by way of a negative temperature coefficient thermistor 21 and a bridge circuit. If it is assumed that the system is in a balanced condition, that is the temperature sensed by the thermistor 21 is near the point selected by the set point potentiometer 24, the voltage on conductors 25 and 26 will be selected so that the direct current amplifier means 13 has an output at 32 that is low thereby not causing an operation of the load 36. If the temperature at the thermistor 21 changes so as to require the operation of load 36, then the voltages on conductors 25 and 26 cause the amplifier means 13 to switch so that the output means 32 rises to approximately the voltage on conductor 10 and drives current through the diode 35 and into the load 36 to energize the load.

To this point the function of the two feedback circuits that have been described have not been taken into account. Their function will now be explained. The direct current amplifier means 13 incorporates both a positive and a negative feedback. However, the values of these feedbacks are chosen so that the net feedback is always negative to prevent the circuit from becoming regenerative. The net overall gain is inversely proportional to the difference between the amounts of positive and negative feedback. The amount of positive feedback is fixed by the resistors 40 and 41 along with the input resistor 27. The resistors 40 and 41 have been shown as having a common point 42 and contain the capacitor 43 to ground 12. On a step input change to the system, such as would occur with a power failure and return of power, or a sudden change in the set point of potentiometer 24, the charge on capacitor 43 cannot instantaneously change, and this delays the change in the amount of the positive feedback. Instantaneously, the amplifier means 13 acts as if it had only negative feedback. However, as the capacitor 43 charges or discharges, the output voltage will change exponentially to a value determined by the magnitude of the input change and the net gain of the amplifier means 13. Therefore, for a step input change, the output voltage change consists of a step (due to the negative feedback) plus the exponential. With the capacitor 43 in the circuit, a time delay arrangement is therefor provided that has a number of distinct advantages. Long time constants can be achieved with a relatively small value of capacitance. The voltage rating of the capacitor 43 need only be a fraction of the supply voltage as the capacitor 43 is in a feedback circuit that does not see the supply voltage, as such, the arrangement requires no special biasing schemes to prevent reverse voltage on the capacitor. In addition, the system can be used without the capacitor 43 if a time delay is not needed, or the capacitor 43 can be added, as in the field, to obtain a time delay where that is desired. This generally outlines the function of the time delay in the positive feedback impedance means.

The addition of the negative feedback impedance means connected, as will be explained provides for an adjustable gain with a minimum change in the operating point of the system. The amount of negative feedback is determined by the effect of the input impedance resistor 30, the negative feedback resistor 48, the resistors 50 and 52, and by the switch position of switch means 47. Switching from the position shown where the switch means 47 connects with 46 to the position where switch element 47 connects with 51 changes the amplifier means 13 from a low to a higher gain. In the position with switch element 47 connected to contact 51, the negative feedback resistor 48 sees only a fraction of the output voltage change, thus providing less negative feedback and a higher gain. In this circuit with a light emitting diode 45, this method for changing amplifier gain has the advantage of having negligible effect on the operating point of the amplifier, that is the input voltage required as a function of temperature to start the increase of the output voltage. This is true because at the point where the amplifier means 13 just starts to come out of its low output saturation, there is essentially no voltage drop across resistor 50. Changing from the position shown to the position where the switch element 47 connects to 51 does not effect the voltage level at the inverting input 31 of the amplifier means 13. The reason for a small voltage across the resistor 50 is that the forward voltage drop of the light emitting diode 45 is approximately 1.5 volts and is approximately equal to the low output saturation voltage of conventional integrated circuit amplifier means 13 which are in the range of 1.7 volts. Therefore, the light emitting diode 45 serves two separate and distinct functions. The first function is that it minimizes the operating point change with a change in gain in the overall system. Also, the light emitting diode 45 thus provides a visual indication of the output voltage magnitude and can be used as an indicator to display the state of operation of the device.

While the present disclosure shows a light emitting diode 45 as a voltage dropping device, it should be understood that the light emitting diode 45 is a nonlinear current-voltage relationship type of device and has a relatively fixed voltage drop when conducting. The light emitting diode 45 could be replaced by a number of different solid state devices such as a four layer diode, a zener diode, or a transistor circuit and still perform the necessary gain-feedback function for the present invention. In the claims of the present application the light emitting diode 45 or similar elements have been referred to generically as "fixed voltage dropping means". It should be understood that this terminology has been selected to be generic and the claims should be interpreted with that understanding.

Figure 2:
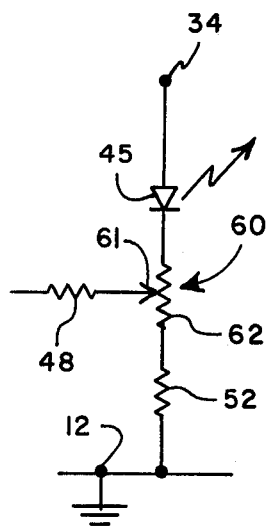
FIG. 2 is a modification of part of the negative feedback circuit for the amplifier means.

In FIG. 2 a modification of the circuit of FIG. 1 is disclosed wherein the resistor 50, switch element 47, and the two terminals 46 and 51 have been replaced by a potentiometer 60. It will be obvious that as the wiper 61 of the potentiometer 60 moves along the resistance element 62 that the effect of the switching disclosed in FIG. 1 can be accomplished by placing the wiper 61 at the top or the bottom of the resistance element 62. Also, any amount of variable gain can be accomplished by placing the wiper 61 in any intermediate position. Once again the light emitting diode 45 and the junction 34 have been disclosed, along with the ground 12 to show the adaptation of the variable feedback in the negative feedback circuit of FIG. 2 as applied to the circuit of FIG. 1.

Figure 3:
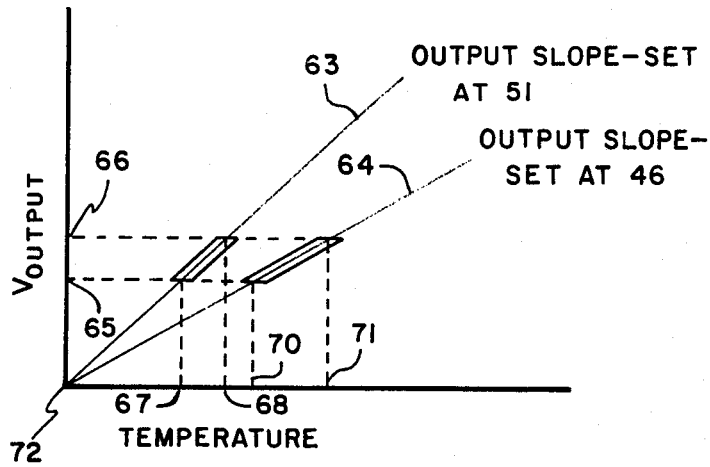
FIG. 3 is a temperature versus voltage output graph showing how a change in gain of the system changes with changes in the negative feedback.

In FIG. 3 two output slope curves have been shown that correspond to the two positions for the switch 47. When the switch 47 is connected to terminal 46 the lower output slope (because of lower amplifier gain) disclosed as curve 64 is provided. When the switch 47 is connected to the terminal 51 the higher output slope 63 is provided.

The two output slope curves 63 and 64 have been plotted on the axis of the output voltage versus temperature at the thermistor 21. As the curves 63 and 64 become steeper, that is have a higher output voltage for a change in temperature, it can be seen that the temperature range for the same voltage output range changes. If the voltage output range is selected between points 65 and 66 it can be seen that for the curve 63, that a temperature range that is relatively narrow between points 67 and 68 is provided. For the same variation in output voltage between the points 65 and 66, a temperature range between 70 and 71 occurs on curve 64. The temperature range between point 67 and 68 is substantially narrower than the range between the point 70 and 71 on the temperature scale. It can thus be seen by changing the gain of the amplifier system, that the output control characteristics of the system can be readily altered. This is very desirable in order to make the condition control device disclosed in FIG. 1 adaptable to many types of loads.

It will be understood that the curves of output slopes 63 and 64 intersect at an operating point 72 and that point 72 is a voltage which is approximately equal to the low output saturation voltage of the amplifier means 13 less a single diode drop. Without the use of a relatively fixed voltage dropping means, such as the light emitting diode 45, in the circuit between the point 34 and the ground 12 any change in the negative feedback circuit through the resistor 48 would cause a substantial shift that would appear to be the same as a set point shift in the operation of the bridge balance arrangement disclosed.

With the present arrangement, a very flexible and unique condition control device utilizing a direct current amplifier system has been disclosed. The device can be operated with or without a time delay, with or without an adjustable negative feedback circuit that adjusts the gain of the amplifier system, and can be operated with or without a light emitting diode as an indicator of the status of the system. By utilizing the various combinations of features in the amplifier system, a single temperature control device or solid state thermostat can be designed which is adaptable to many different types of loads. Since the present invention is subject to many changes in its circuit arrangement within the scope of the disclosed invention, the applicants wish to be limited in the scope of their invention solely by the appended claims.

The embodiments of the invention in which an exclusive property or right is claimed are defined as follows:

1. A direct current amplifier system, including: proportional direct current amplifier means adapted to be energized from a single ended direct current power supply and having non-inverting input means, inverting input means, and output means; positive feedback impedance means connected from said output means to said non-inverting input means to provide a level of positive feedback for said amplifier means; negative feedback impedance means connected from said output means to said inverting input means to provide a level of negative feedback for said amplifier means; said negative feedback impedance means including nonlinear fixed voltage dropping means; and said voltage dropping means and further impedance means connecting said output means to said amplifier means lowest energizing potential; said level of said negative feedback exceeding said level of said positive feedback under steady state operating conditions of said amplifier system.

2. A direct current amplifier system as described in claim 1 wherein said positive feedback impedance means is resistive means; and said negative feedback impedance means includes said nonlinear voltage dropping means and resistive means.

3. A direct current amplifier system as described in claim 2 wherein said negative feedback resistive means is variable to vary the amount of negative feedback thereby varying the gain of said amplifier system.

4. A direct current amplifier system as described in claim 3 wherein said fixed voltage dropping means is a light emitting diode with said diode both acting to drop a fixed voltage and to provide a visual indication of an output condition of said amplifier system.

5. A direct current amplifier system as described in claim 4 wherein said variable negative feedback resistance means includes a fixed resistor and two position selection means; said two position selection means being arranged to selectively include or bypass said fixed resistor to vary said negative feedback of said amplifier system.

6. A direct current amplifier system as described in claim 2 wherein said positive feedback resistive means is a pair of resistors; and energy storage means connecting a common connection of said pair of resistors to said lowest energizing potential to create a time delay in the effect of a change in said positive feedback.

7. A direct current amplifier system as described in claim 6 wherein said energy storage means is a capacitor and said pair of resistors being of equal value.

8. A direct current amplifier system as described in claim 7 wherein said negative feedback resistance means is variable to vary the amount of negative feedback thereby varying the gain of said amplifier system.

9. A direct current amplifier system as described in claim 8 wherein said fixed voltage dropping means is a light emitting diode with said diode both acting to drop a fixed voltage and to provide a visual indication of an output condition of said amplifier system.

10. A condition control device utilizing a direct current amplifier system, including: condition responsive signal means providing a varying voltage differential as a function of a varying sensed condition; proportional direct current amplifier means adapted to be energized from a single ended direct current power supply and having non-inverting input means, inverting input means, and output means; said condition responsive signal means being connected to said amplifier input means to cause said output means to vary with changes in said sensed condition; positive feedback impedance means connected from said output means to said non-inverting input means to provide a level of positive feedback for said amplifier means; negative feedback impedance means connected from said output means to said inverting input means to provide a level of negative feedback for said amplifier means; said negative feedback impedance means including nonlinear fixed voltage dropping means; and said voltage dropping means and further impedance means connecting said output means to said amplifier means lowest energizing potential; said level of said negative feedback exceeding said level of positive feedback under steady state operating conditions of said amplifier system.

11. A condition control device utilizing a direct current amplifier system as described in claim 10 wherein said condition responsive signal means includes a temperature responsive element in a bridge circuit.

12. A condition control device utilizing a direct current amplifier system as described in claim 11 wherein said positive feedback impedance means is resistive means; and said negative feedback impedance means includes said nonlinear voltage dropping means and variable resistance means to vary the amount of negative feedback thereby varying the gain of said amplifier system.

13. A condition control device utilizing a direct current amplifier system as described in claim 12 wherein said fixed voltage dropping means is a light emitting diode with said diode both acting to drop a fixed voltage and to provide a visual indication of an output condition of said amplifier system.

14. A condition control device utilizing a direct current amplifier system as described in claim 13 wherein said positive feedback resistive means is a pair of resistors; and capacitor means connecting a common connection of said pair of resistors to said lowest energizing potential to create a time delay in the effect of a change in said positive feedback.

15. A condition control device utilizing a direct current amplifier system as described in claim 14 wherein said temperature responsive element is a negative temperature coefficient thermistor.

* * * * *